United States Patent
Welti et al.

(10) Patent No.: US 11,601,752 B2
(45) Date of Patent: Mar. 7, 2023

(54) SOUND QUALITY ENHANCEMENT AND PERSONALIZATION

(71) Applicant: HARMAN INTERNATIONAL INDUSTRIES, INCORPORATED, Stamford, CT (US)

(72) Inventors: Todd S. Welti, Thousand Oaks, CA (US); Omid Khonsaripour, Thousand Oaks, CA (US); Sean Edward Olive, Oak Park, CA (US)

(73) Assignee: Harman International Industries, Incorporated, Stamford, CT (US)

( * ) Notice: Subject to any disclaimer, the term of this patent is extended or adjusted under 35 U.S.C. 154(b) by 0 days.

(21) Appl. No.: 17/271,569

(22) PCT Filed: Aug. 29, 2019

(86) PCT No.: PCT/US2019/048918
§ 371 (c)(1),
(2) Date: Feb. 25, 2021

(87) PCT Pub. No.: WO2020/047324
PCT Pub. Date: Mar. 5, 2020

(65) Prior Publication Data
US 2021/0195328 A1 Jun. 24, 2021

Related U.S. Application Data

(60) Provisional application No. 62/725,926, filed on Aug. 31, 2018.

(51) Int. Cl.
*H04R 3/04* (2006.01)

(52) U.S. Cl.
CPC .................................. *H04R 3/04* (2013.01)

(58) Field of Classification Search
None
See application file for complete search history.

(56) References Cited

U.S. PATENT DOCUMENTS

| | | |
|---|---|---|
| 2014/0334644 A1 | 11/2014 | Selig |
| 2016/0197591 A1 | 7/2016 | Greenwood |
| 2016/0366518 A1 | 12/2016 | Strogis et al. |

FOREIGN PATENT DOCUMENTS

| | | |
|---|---|---|
| CN | 1447624 A | 10/2003 |
| CN | 102474541 A | 5/2012 |

*Primary Examiner* — James K Mooney
(74) *Attorney, Agent, or Firm* — Artegis Law Group, LLP

(57) ABSTRACT

A computer-implemented method comprises identifying an audio playback device configured to reproduce audio content based on an audio input signal, wherein the audio playback device has a previously measured characteristic frequency response; retrieving the previously measured characteristic frequency response associated with the audio playback device; generating, based on the previously measured characteristic frequency response and a preferred frequency response curve for a plurality of users, a frequency response filter that modifies the previously measured characteristic frequency response of the audio playback device to a modified frequency response; processing the audio input signal with the frequency response filter to generate a filtered audio signal that differs in relative amplitude from the audio input signal in one or more frequency bands; and causing the audio playback device to play back the filtered audio signal.

19 Claims, 11 Drawing Sheets

SOUND QUALITY ENHANCEMENT AND PERSONALIZATION

CROSS-REFERENCE TO RELATED APPLICATIONS

This application is a U.S. National Stage patent application of International Patent Application No. PCT/US2019/048918, filed Aug. 29, 2019, the benefit of which is claimed, and claims priority to and benefit of the U.S. Provisional Patent Application titled, "SOUND QUALITY PERSONALIZATION APPLICATION," filed on Aug. 31, 2019 and having Ser. No. 62/725,926. The subject matter of these related applications are hereby incorporated herein by reference.

BACKGROUND

Field of the Embodiments

Embodiments of the present disclosure relate generally to sound reproduction and, more specifically, to sound quality enhancement and personalization.

Description of the Related Art

Sound recording captures music or other sounds for subsequent playback with a suitable audio system or other playback device. Thus, a particular musical performance can be enjoyed by a plurality of listeners at various times and with different playback devices, such as headphones, a car-stereo system, a home entertainment system, and the like. However, upon playback, the sound reproduced by a particular playback device can vary significantly from the original sound captured in the recording process. While the quality of the recording can contribute to this variance, another important factor is the frequency response of the speakers playing back the sound recording. Frequency response of a loudspeaker, system of speakers, or other audio system is a quantitative measure of the output spectrum of the audio system in response to a stimulus, and thereby characterizes the dynamics of the system.

An ideal audio system generates an output signal with little or no distortion of the input signal on which the output signal is based. That is, the ideal audio system behaves with a uniform, flat magnitude of frequency response across the operating frequencies of the system (e.g., 20 Hz to 20 kHz). In addition, the output signal is delayed by precisely the same amount of time at all operating frequencies of the system. In practice, any given audio system has a different frequency response that varies from the above-described frequency response of an ideal audio system. Furthermore, many loudspeakers have a rough, non-flat frequency response that include peaks and dips at certain frequencies and/or overemphasized responses at certain frequencies. Generally, loudspeakers with a non-flat frequency response generate output with added resonances or colorations that are audible to and universally disliked by most users. Consequently, even though great effort and resources have been directed to capturing a particular musical performance with a high-quality recording, the frequency response of the playback device can significantly degrade the user experience when listening to the recording.

In light of the above, more effective techniques for improving the fidelity of audio output generated by an audio system to an audio input signal would be useful.

SUMMARY

The various embodiments set forth techniques for modifying the frequency response of an audio system. The techniques include identifying an audio playback device configured to reproduce audio content based on an audio input signal, wherein the audio playback device has a previously measured characteristic frequency response; retrieving the previously measured characteristic frequency response associated with the audio playback device; generating, based on the previously measured characteristic frequency response and a preferred frequency response curve for a plurality of users, a frequency response filter that modifies the previously measured characteristic frequency response of the audio playback device to a modified frequency response; processing the audio input signal with the frequency response filter to generate a filtered audio signal that differs in relative amplitude from the audio input signal in one or more frequency bands; and causing the audio playback device to play back the filtered audio signal.

At least one advantage of the disclosed embodiments is that a user can have an improved listening experience during playback of recorded music and other audio content. More specifically, the disclosed embodiments enable an audio system to generate audio output that more closely approximates original sound content prior to being recorded, even though the audio system has an inherent frequency response that substantially affects the audio output during playback. Another advantage is that a user can easily modify audio output generated by the audio system to match a personalized acoustic response that corresponds to an equalization of the original sound content. A further advantage is that a user can generate such a personalized acoustic response using the audio system.

BRIEF DESCRIPTION OF THE SEVERAL VIEWS OF THE DRAWINGS

So that the manner in which the above recited features of the one or more embodiments can be understood in detail, a more particular description of the one or more embodiments, briefly summarized above, may be had by reference to certain specific embodiments, some of which are illustrated in the appended drawings. It is to be noted, however, that the appended drawings illustrate only typical embodiments and are therefore not to be considered limiting of its scope in any manner, for the scope of the various embodiments subsumes other embodiments as well.

For clarity, identical reference numbers have been used, where applicable, to designate identical elements that are common between figures. It is contemplated that features of one embodiment may be incorporated in other embodiments without further recitation.

DETAILED DESCRIPTION

In general, any audio system, such as a loudspeaker or system of loudspeakers, has a non-ideal frequency response that can include peaks and dips at certain frequencies and/or overemphasized responses at certain frequencies. Consequently, even when a high-quality recording is played back by an audio system, the frequency response of the playback device can significantly degrade the user experience when listening to the recording. One such scenario is illustrated in FIG. 1.

Figure 1:
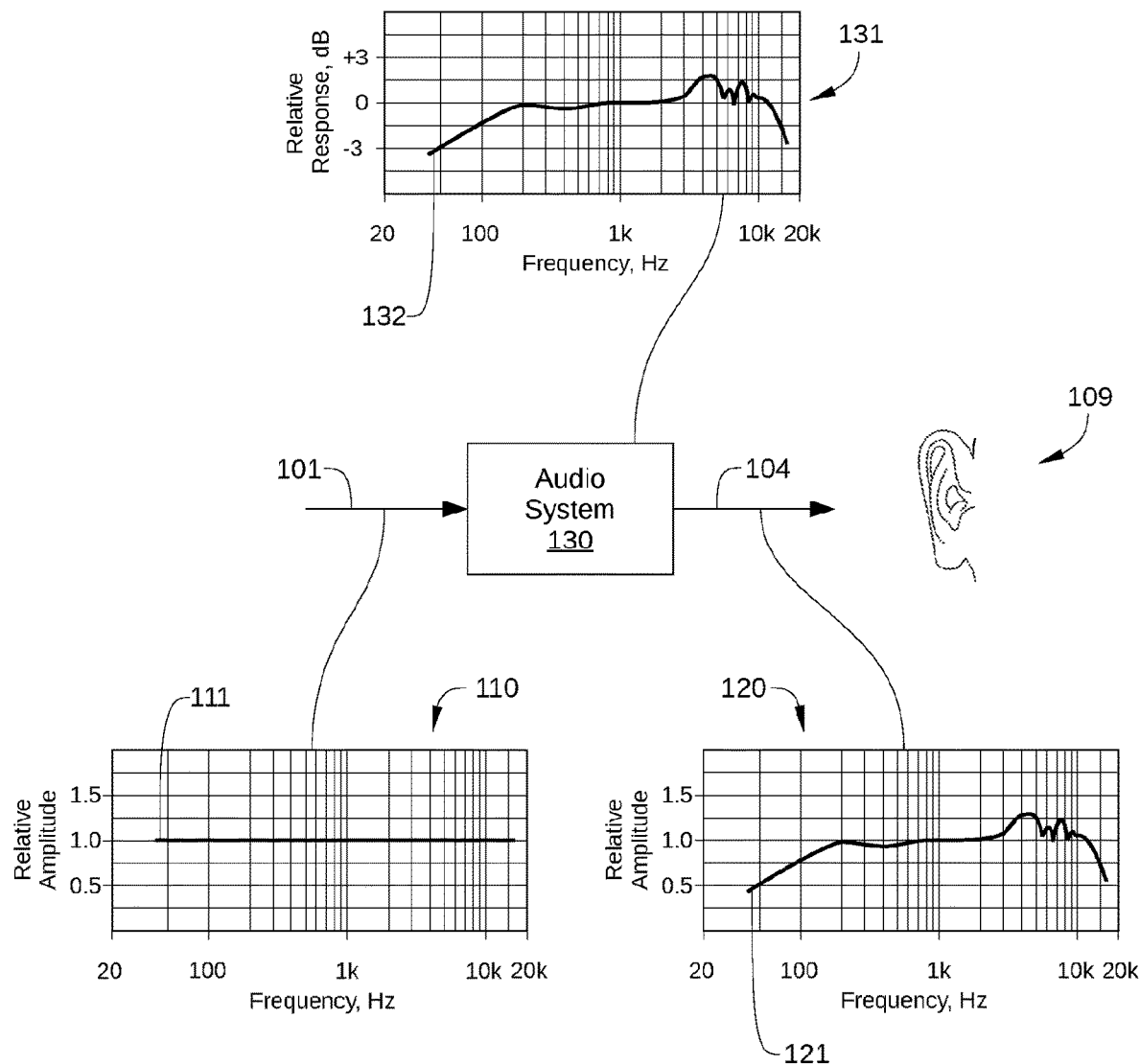
FIG. 1 schematically illustrates an audio system receiving an audio input signal and generating an audio output that has been affected by the frequency response of the audio system.

FIG. 1 schematically illustrates an audio system 130 receiving an audio input signal 101 and generating an audio output 104 that has been affected by the frequency response of audio system 130. Audio system 130 can be any device or system that generates audio output 104 based on audio input signal 101, and can include one or more amplifiers and one or more loudspeakers or systems of loudspeakers. Audio input signal 101 can be an analog or digital signal that corresponds to an instance of audio content, such as a musical recording, a voice recording, a sound component of an instance of video content, and the like. For purposes of illustration, in the instance illustrated in FIG. 1, audio input signal 101 has an equal amplitude at each frequency (i.e., audio input signal 101 is white noise), as indicated by an amplitude 111 in a plot 110 of input signal amplitude in the frequency domain. In other instances, audio input signal 101 can be any other audio signal.

Upon receiving audio input signal 101, audio system 130 generates corresponding audio output 104, which is then heard by a user 109. Audio system 130 has a frequency response 132, which is depicted in a Bode magnitude plot 131. As shown, frequency response 132 of audio system 130 is not ideal, and therefore is not flat and neutral. Instead, frequency response 132 has a different relative response at different frequency bands. As a result, audio output 104 can vary significantly from the actual audio from which audio output signal 104 is generated, and can adversely affect the listening experience of user 109. For example, in FIG. 1, audio input signal 101 has an equal amplitude at each frequency, while audio output 104 has a different relative amplitude at different frequencies, as indicated by an amplitude 121 in a plot 120 of audio output signal amplitude in the frequency domain. Further, because audio input signal 101 has an equal amplitude at each frequency in the instance illustrated in FIG. 1, the different relative amplitudes of audio output 104 at each frequency can be seen to correspond to variations in frequency response 132 of audio system 130.

According to various embodiments, a frequency response application modifies an input signal for an audio system to compensate for a frequency response of the audio system. In this way, audio output from the audio system more closely approximates the sound employed to generate the input signal. For example, in some embodiments, the frequency response application generates or receives a device-specific frequency response filter to perform the modification of the input signal. The input signal is then processed by the device-specific frequency response filter before the audio system plays back the input signal. One such embodiment is illustrated in FIG. 2.

Figure 2:
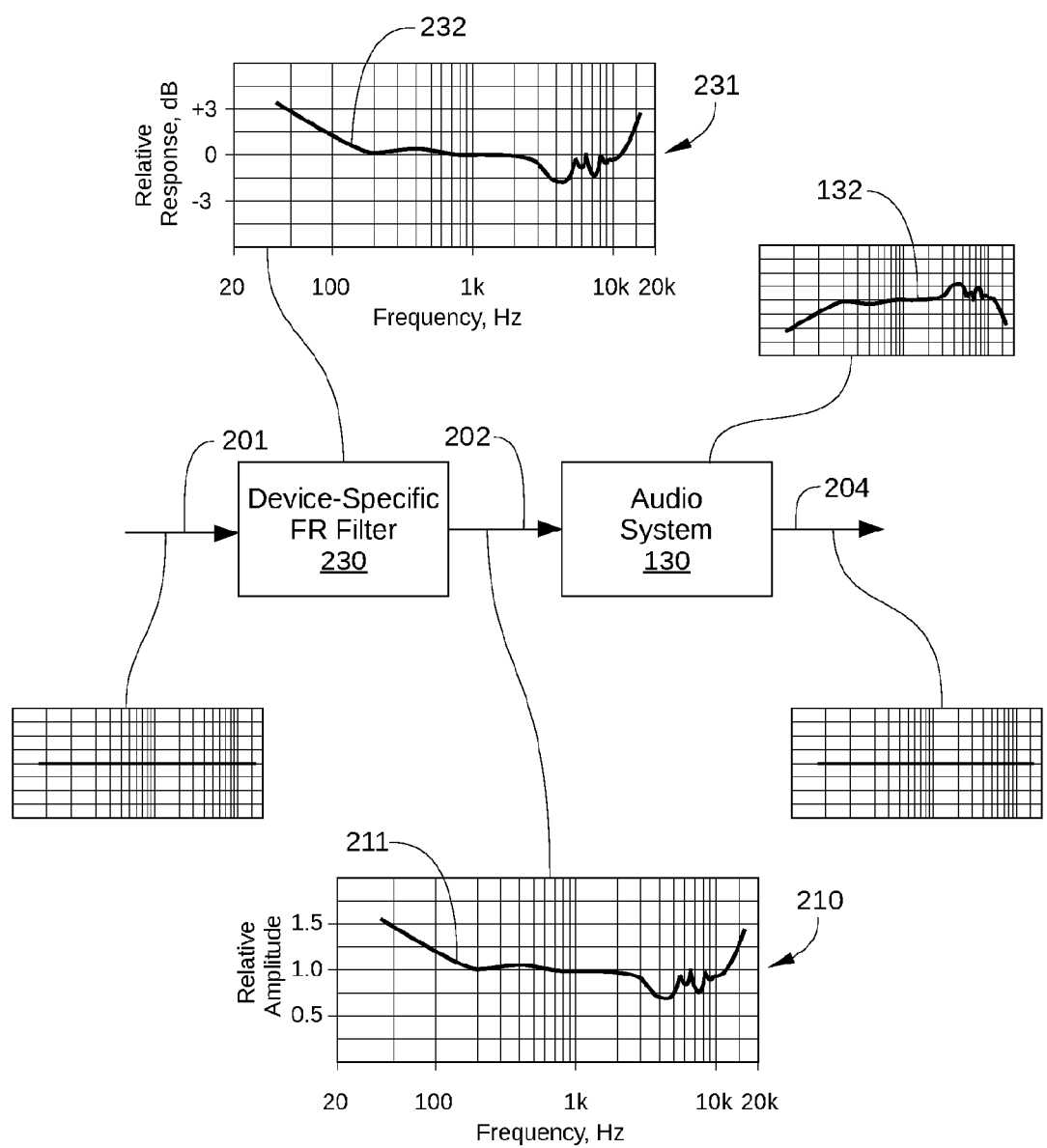
FIG. 2 schematically illustrates the audio system of FIG. 1 receiving a filtered audio input signal and generating a modified audio output, according to various embodiments of the present disclosure.

FIG. 2 schematically illustrates audio system 130 receiving a filtered audio input signal 202 and generating a modified audio output 204, according to various embodiments of the present disclosure. As shown, an audio input signal 201 is processed by a device-specific frequency response (FR) filter 230 to generate filtered audio input signal 202. Audio system 130 then receives and plays back filtered audio input signal 202 to generate modified audio output 204. For clarity of description, audio input signal 201 is depicted as white noise, i.e., having equal relative amplitude in all frequencies. However, audio input signal 201 can be any other audio input signal.

Device-specific FR filter 230 has a frequency response 232, which is depicted in a Bode magnitude plot 231. In the embodiment illustrated in FIG. 2, frequency response 232 of device-specific FR filter 230 is selected to compensate for most or all of non-ideal frequency response 132 of audio system 130. As a result, at each frequency, filtered audio input signal 202 generally has a different amplitude than audio input signal 201, as indicated by an amplitude 211 in a plot 210 of filtered audio input signal amplitude in the frequency domain. For example, at each frequency band for which frequency response 132 generates a gain, frequency response 232 includes a corresponding loss. Conversely, at each frequency band for which frequency response 132 generates a loss, frequency response 232 includes a corresponding gain.

In some embodiments, frequency response 232 can be generated based on a measured frequency response curve for audio system 130 that is to be canceled or compensated for, such as frequency response 132. In some embodiments, a wide frequency spectrum or other multi-frequency signal is played back by audio system 130, such as a pink noise signal or equivalent. The impulse response of audio system 130 is then calculated by deconvolution of this input signal and the resultant audio output of audio system 130. In some embodiments, the above process is performed multiple times on audio system 130 and/or on multiple instances of audio system 130. Thus, variations in sound measurements and/or variations between different instances of the same model of audio system can be addressed via averaging.

In the instance illustrated in FIG. 2, audio input signal 201 has an equal amplitude at each frequency. Consequently, the different relative amplitudes of filtered audio input signal 202 at each frequency can be seen to correspond to variations in frequency response 232 of device-specific FR filter 230. Because frequency response 232 is selected to to compensate for most or all of non-ideal frequency response 132, playback of filtered audio input signal 202 by audio system 130 generates modified audio output 204, which has substantially the same relative amplitude at each frequency as audio input signal 201. Thus, device-specific FR filter 230 improves the fidelity of sound heard by a listener to the sound employed to generate audio input signal 201.

In the embodiment illustrated in FIG. 2, frequency response 232 of device-specific FR filter 230 is selected to compensate for most or all of non-ideal frequency response 132 of audio system 130. In other embodiments, a frequency response of a device-specific FR filter is selected to have some other frequency response curve that modifies an audio output of audio system 130. In such embodiments, the frequency response of the device-specific FR filter is selected so that, when an audio input signal is processed by the device-specific FR filter and then played back by audio system 130, the audio input signal has effectively been modified by a target frequency response curve. That is, the combination of the frequency response of the device-specific FR filter and the frequency response of audio system 130 approximates a target frequency response curve. One such embodiment is illustrated in FIG. 3.

Figure 3:
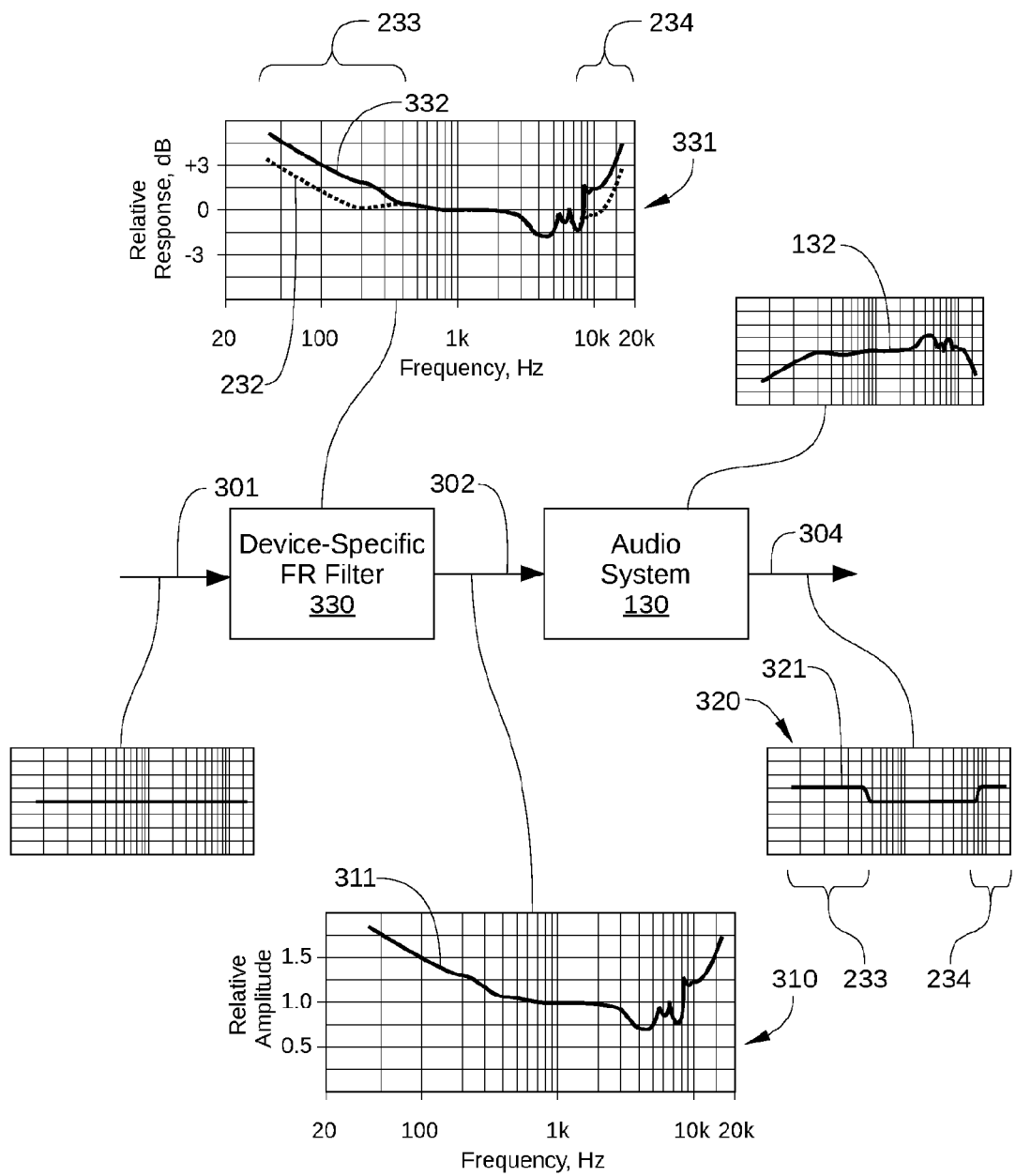
FIG. 3 schematically illustrates the audio system of FIG. 1 receiving a filtered audio input signal and generating a modified audio output, according to various embodiments of the present disclosure.

FIG. 3 schematically illustrates audio system 130 receiving a filtered audio input signal 302 and generating a modified audio output 304, according to various embodiments of the present disclosure. As shown, an audio input signal 301 is processed by a device-specific FR filter 330 to generate filtered audio input signal 302. Audio system 130 then plays back filtered audio input signal 302 to generate modified audio output 304. For clarity of description, audio input signal 301 is depicted as white noise, i.e., having equal relative amplitude in all frequencies. However, audio input signal 301 can be any other audio input signal.

Device-specific FR filter 330 has a frequency response 332, which is depicted in a Bode magnitude plot 331. In the embodiment illustrated in FIG. 3, frequency response 332 of device-specific FR filter 330 is selected so that, when combined with non-ideal frequency response 132 of audio system 130, audio input signal 302 is effectively converted to an audio output by an audio system that has a target frequency response curve. That is, modified audio output 304 approximates an audio output that is generated by an audio system having the target frequency response curve. Thus, despite the non-ideal (and typically undesirable) frequency response 132 of audio system 130, modified audio output 304 does not include changes in relative amplitude that correspond to frequency response 132 and instead includes changes in relative amplitude that correspond to the target frequency response curve.

For reference, Bode magnitude plot 331 also shows frequency response 232 (dashed line) for device-specific FR filter 230, which corresponds to a frequency response that substantially compensates for frequency response 132 of audio system 130. By contrast, frequency response 332 corresponds to a combination of frequency response 232 and a target frequency response curve. In the instance illustrated in FIG. 3, the target frequency response curve includes an increase in relative response in a low-frequency band 233 and an increase in relative response in a high-frequency band 234. As a result, relative to audio input signal 301, modified audio output 304 has greater relative amplitude in low-frequency band 233 and in high-frequency band 234, as indicated by an amplitude 321 in a plot 320 of audio output signal amplitude in the frequency domain. An instance of the target frequency response curve that corresponds to the amplitude 321 of audio output signal 304 is illustrated in FIG. 4.

Figure 4:
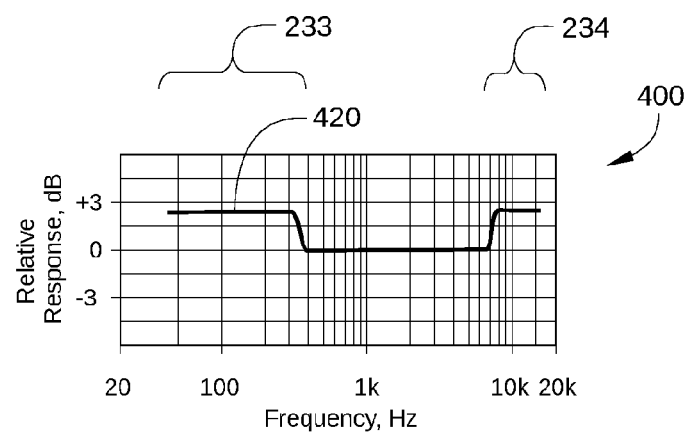
FIG. 4 is a Bode magnitude plot of a target frequency response curve, according to an embodiment of the present disclosure.

FIG. 4 is a Bode magnitude plot 400 of a target frequency response curve 420, according to an embodiment of the present disclosure. As shown, target frequency response curve 420 includes an increase in relative response in low-frequency band 233 and another increase in relative response in high-frequency band 234. Thus, when an audio input signal is played back by an audio system having a frequency response substantially similar to target frequency response curve 420, the audio output signal so generated has relative amplitude of in the frequency domain similar to that of modified audio output 304 shown in FIG. 3.

In some embodiments, target frequency response curve 420 can be based on a frequency response that is empirically determined to be most acceptable to an average listener or to a specific group of listeners. For example, target frequency response curve 420 can be based on the preferred frequency response of a plurality of listeners, such as an average of the preferred frequency response for each of dozens or hundreds of listeners. In such embodiments, the plurality of listeners can each indicate a preferred frequency response while being tested in a controlled listening environment. Thus, target frequency response curve 420 is not limited to the specific curve profile illustrated in FIG. 4, and can include one or more frequency bands having a decrease in relative response, frequency bands having different increases in relative response, frequency bands in which an increase or decrease in relative response is not a constant value, etc.

Returning to FIG. 3, frequency response 332 can be generated based on a measured frequency response curve for audio system 130 (i.e., frequency response 132) and on a particular target frequency response curve. For example, in some embodiments, frequency response 332 can be generated based on a combination of frequency response 232 (shown in FIG. 2) and target frequency response curve 420 (shown in FIG. 4).

Figure 5:
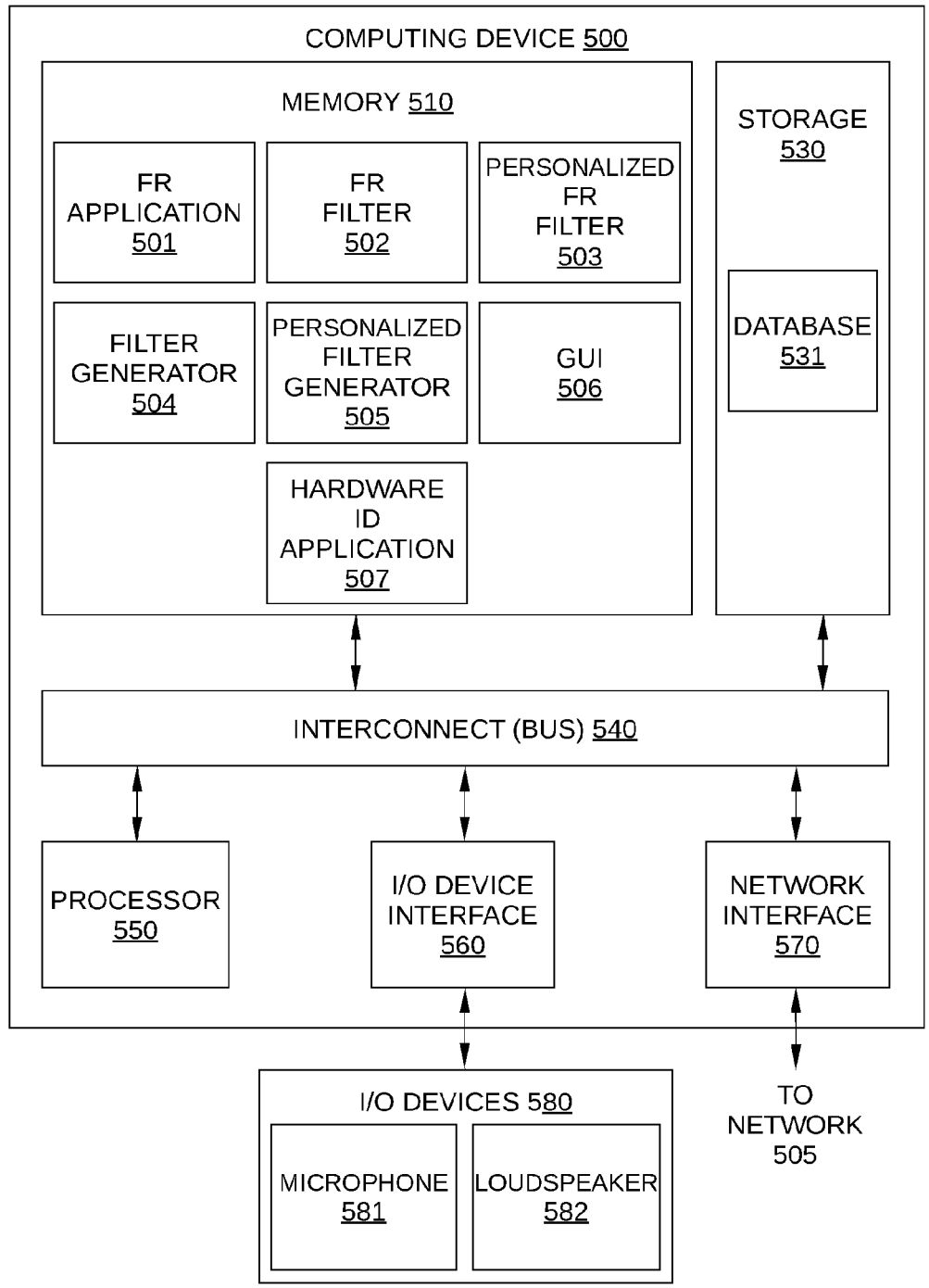
FIG. 5 is a conceptual block diagram of a computing system configured to implement one or more aspects of the various embodiments.

FIG. 5 is a conceptual block diagram of a computing system 500 configured to implement one or more aspects of the various embodiments. Computing system 500 may be any type of device capable of executing application programs including, without limitation, instructions associated with an FR application 501, an FR filter 502, a personalized FR filter 503, a filter generator 504, a personalized filter generator 505, a graphical user interface (GUI) 506, and/or a hardware identification (ID) application 507. For example, and without limitation, computing system 500 may be an electronic tablet, a smartphone, a laptop computer, an infotainment system incorporated into a vehicle, a home entertainment system, etc. Alternatively, computing system 500 may be implemented as a stand-alone chip, such as a microprocessor, or as part of a more comprehensive solution that is implemented as an application-specific integrated circuit (ASIC), a system-on-a-chip (SoC), and so forth. It is noted that the computing system described herein is illustrative and that any other technically feasible configurations fall within the scope of the present invention.

As shown, computing system 500 includes, without limitation, an interconnect (bus) 540 that connects a processor 550, an input/output (I/O) device interface 560 coupled to I/O devices 580, memory 510, a storage 530, and a network interface 570. Processor 550 may be any suitable processor implemented as a central processing unit (CPU), an application-specific integrated circuit (ASIC), a field programmable gate array (FPGA), any other type of processing unit, or a combination of different processing units, such as a CPU configured to operate in conjunction with a digital signal processor (DSP). For example, in some embodiments, processor 550 includes a CPU and a DSP. In general, processor 550 may be any technically feasible hardware unit capable of processing data and/or executing instructions to facilitate operation of computing system 500 of FIG. 5, as described herein. Further, in the context of this disclosure, the computing elements shown in computing device 500 may correspond to a physical computing system (e.g., a system in a data center) or may be a virtual computing instance executing within a computing cloud.

I/O devices 580 may include devices capable of providing input, such as a keyboard, a mouse, a touch-sensitive screen, a microphone 581 and so forth, as well as devices capable of providing output, such as a loudspeaker 582 and a display screen. The display screen may be a computer monitor, a video display screen, a display apparatus incorporated into a hand held device, or any other technically feasible display screen. Particular instances of loudspeaker 582 can include one or more loudspeakers that are elements of an audio system, such as audio system 130 in FIG. 1.

I/O devices 580 may include additional devices capable of both receiving input and providing output, such as a touchscreen, a universal serial bus (USB) port, and so forth. Such I/O devices 580 may be configured to receive various types of input from an end-user of computing device 500, and also to provide various types of output to the end-user of computing device 500, such as displayed digital images or digital videos. In some embodiments, one or more of I/O devices 580 are configured to couple computing device 500 to communications network 505.

I/O interface 560 enables communication of I/O devices 580 with processor 550. I/O interface generally includes the requisite logic for interpreting addresses corresponding to I/O devices 580 that are generated by processor 550. I/O interface 560 may also be configured to implement handshaking between processor 550 and I/O devices 580, and/or generate interrupts associated with I/O devices 580. I/O interface 560 may be implemented as any technically feasible CPU, ASIC, FPGA, any other type of processing unit or device.

Network interface 570 is a computer hardware component that connects processor 550 to communication network 505. Network interface 570 may be implemented in computing device 500 as a stand-alone card, processor, or other hardware device. In embodiments in which communication network 505 includes a WiFi network or a WPAN, network interface 570 includes a suitable wireless transceiver. Alternatively or additionally, network interface 570 may be configured with cellular communication capability, satellite telephone communication capability, a wireless WAN communication capability, or other types of communication capabilities that allow for communication with communication network 505 and other computing devices 500 external to computing system 500.

Memory 510 may include a random access memory (RAM) module, a flash memory unit, or any other type of memory unit or combination thereof. Processor 550, I/O device interface 560, and network interface 570 are configured to read data from and write data to memory 510. Memory 510 includes various software programs that can be executed by processor 550 and application data associated with said software programs, including FR application 501, FR filter 502, personalized FR filter 503, filter generator 504, personalized filter generator 505 and/or GUI 506, and/or hardware ID application 507.

Storage 530 can include a non-transitory computer-readable medium, such as a non-volatile storage device. In some embodiments, storage 530 includes a database 531 of frequency response curves of various audio systems, loudspeakers, or other devices. Additionally or alternatively, in some embodiments, database 531 includes filter response pre-sets, device-specific FR filters, and the like. Alternatively, in some embodiments, database 531 can reside remotely from computing system 500, for example in a cloud-computing environment.

FR application 501 is configured to implement one or more aspects of the various embodiments described herein. For example, in some embodiments, FR application 501 enables an audio system to generate audio output that closely approximates original sound content prior to being recorded, even though the audio system has an inherent frequency response that substantially alters the audio output during playback. Further, in some embodiments, FR application 501 enables a user to modify audio output generated by the audio system to match a personalized acoustic response for the audio system. In some embodiments, the functionality of one or more of FR filter 502, personalized FR filter 503, filter generator 504, personalized filter generator 505, GUI 506, and/or hardware ID application 507 may be incorporated in FR application 501.

FR filter 502 is configured to modify an audio input signal according to a certain frequency response curve. For example, in some embodiments, FR filter 502 is a device-specific FR filter configured to modify an audio input signal to compensate for and/or cancel a known frequency response of a specific audio system, such as audio system 130. Alternatively, in some embodiments, a frequency response of FR filter 502 is selected so that an audio input signal that is processed by FR filter 502 and is played back by a specific audio system results in an audio output that approximates an audio output that is generated by an audio system having a target frequency response curve.

Personalized FR filter 503 is configured to modify an audio input signal according to a particular user-selected frequency response curve. In some embodiments, the particular frequency response curve is selected by a user during a set-up procedure (described below in conjunction with FIG. 8). For example, personalized FR filter 503 can be configured to implement certain equalization parameters that effectively equalize original sound content in a fashion selected by a user. When an audio input signal is processed by FR filter 502 and personalized FR filter 503 and is then played back by the audio system for which FR filter 502 is selected, the resultant audio output generated by the audio system closely approximates an audio output that is generated by an audio system having the user-selected frequency response to curve. One such embodiment is illustrated in FIG. 6.

Figure 6:
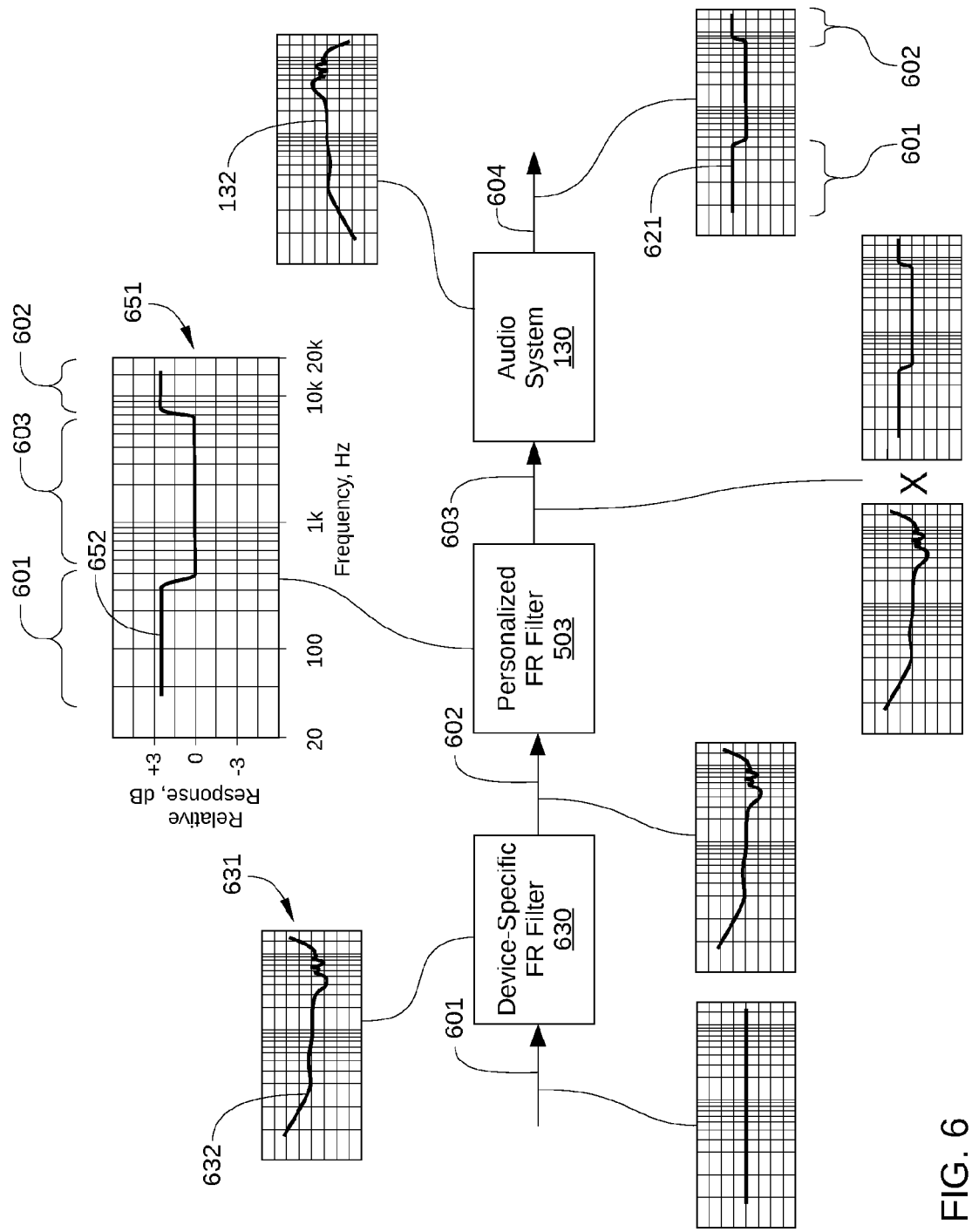
FIG. 6 schematically illustrates an audio system receiving a personalized audio input signal and generating a personalized audio output, according to various embodiments of the present disclosure.

FIG. 6 schematically illustrates audio system 130 receiving a personalized audio input signal 603 and generating a personalized audio output 604, according to various embodiments of the present disclosure. As shown, an audio input signal 601 is processed by a device-specific FR filter 630 to generate a filtered audio input signal 602. For example, in some embodiments, device-specific FR filter 630 is configured with a frequency response 632 that compensates for the frequency response of audio system 130, as depicted in a Bode magnitude plot 631. Filtered audio input signal 602 is then processed by a personalized FR filter 503 to generate personalized audio input signal 603. Audio system 130 then plays back personalized audio input signal 603 to generate personalized audio output 604. For clarity of description, audio input signal 601 is depicted as white noise, i.e., having equal relative amplitude in all frequencies. However, audio input signal 601 can be any other audio input signal.

Personalized FR filter 503 has a frequency response 652, which is depicted in a Bode magnitude plot 651. In the embodiment illustrated in FIG. 6, frequency response 652 of personalized FR filter 503 corresponds to a user-selected frequency response curve. Thus, when audio input signal 601 is processed by device-specific FR filter 630 and personalized FR filter 503, and the resulting personalized audio input signal 603 is played back by audio system 130, personalized audio output 604 is generated, which has a relative amplitude 621 equivalent to an audio output by an audio system that has a frequency response 652.

In the instance illustrated in FIG. 6, the user-selected frequency response curve includes an increase in relative response in a low-frequency band 601, an increase in relative response in a high-frequency band 602, and no gain or loss in a mid-frequency band 603. In other instances, the user-selected frequency response curve can include any other technically feasible combination of gains and/or losses in different frequency bands, depending on specific user sound preferences.

Returning to FIG. 5, hardware ID application 507 is configured to determine or identify the model of the audio system associated with computing system 500. In some embodiments, hardware ID application 507 identifies the audio playback device(s) of the audio system based on information input by a user. In other embodiments, hardware ID application 507 identifies the audio playback device(s) by querying the device directly, for example by receiving a media access control (MAC) address via a wireless connection with the audio playback device.

Filter generator 504 is configured to generate FR filter 502 based on a frequency response of audio system 130, using any suitable algorithm. In some embodiments, the frequency response of audio system 130 and/or a plurality of other audio systems is stored in database 531. In other embodiments, FR application 501 is configured to request the frequency response of audio system 130 from a remote computing device once audio system 130 has been identified. In either case, the frequency response of audio system 130 can be based on measurements made of audio system 130. In the embodiment illustrated in FIG. 5, filter generator 504 resides in memory 510. In other embodiments, the functionality of filter generator 504 can reside remotely, and FR application 501 is configured to request FR filter 502 from a remote computing device or database.

Personalized filter generator 505 is configured to generate personalized FR filter 503 based on one or more user inputs. In some embodiments, personalized filter generator 505 employs GUI 506 to prompt a user to enter pertinent information and/or to provide user inputs that enable personalized filter generator 505 to select or generate a specific personalized FR filter 503. One such embodiment is illustrated in FIGS. 7A-7D.

Figure 7A:
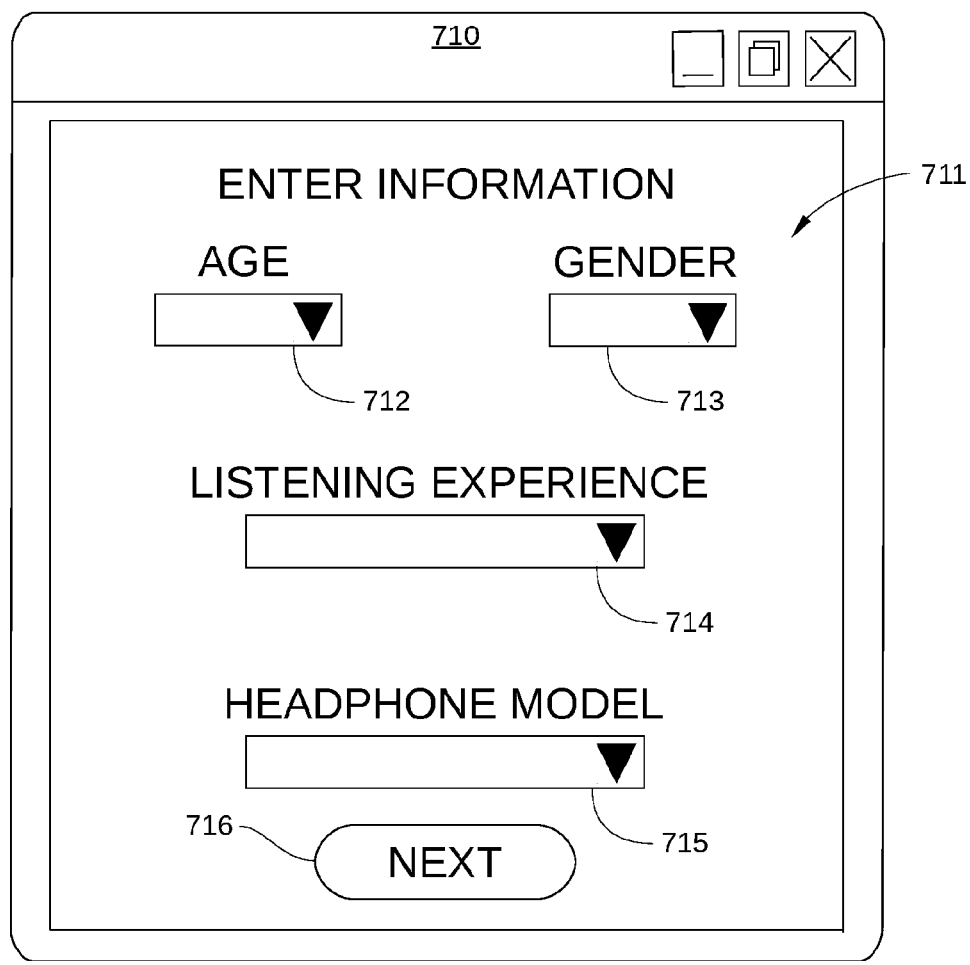
FIG. 7A schematically illustrates a user information screen, according to an embodiment of the present disclosure.

FIG. 7A schematically illustrates a user information screen 710, according to an embodiment of the present disclosure. User information screen 710 can be displayed via GUI 506 on one of I/O devices 580 of computing system 500. As shown, user information screen 710 includes an advancement button 716 and various information entry elements 711 for user entry of user information, such as drop-down menus, radio buttons, and/or graphical representations of dials, switches, or other selectable or adjustable icons.

In some embodiments, one or more information entry elements 711 (e.g., drop-down menus 712 and 713) enable a user to input user-based information, such as user gender, user age, and other demographic user information. In such embodiments, personalized filter generator 505 is configured to generate a personalized FR filter 503 based on such demographic user information. For example, a user may enter an age of 55 and a gender as male. FR application 501 then retrieves existing listening test data associated with the entered demographic data, for example from a local or remote database 531. FR application 501 then generates a personalized preset filter response (i.e., personalized FR filter 503) and/or retrieves one or more highly-ranked preset filter responses of other users within a similar demographic cohort.

In some embodiments, one or more information entry elements 711 (e.g., a drop-down menu 714) enable a user to input other user-specific information, such as preferred listening genres and/or listening experience (i.e., experience with customizing audio system features). In such embodiments, the level of listening experience may be a qualitative estimate reflecting the amount of experience or training the user has in listening to music. In some embodiments, FR application 501 enables users having a training or experience level that exceeds a specified threshold to perform additional inputs as part of the personalization process, as described below.

In some embodiments, one or more information entry elements 711 (e.g., a drop-down menu 715) enable a user to input device-specific information, such as a specific model of audio system for which a specific personalized FR filter 503 is to be generated. In such embodiments, when generating the personalized acoustic filter response, filter generator 504 may incorporate specific operating characteristics of the specified headphone model or specified speaker model. For example, in some embodiments, when the user enters a specified headphone model via drop-down menu 715, FR application 501 retrieves a characteristic frequency response spectrum for the specified headphone model. FR application 501 then adjusts the playback of an input audio signal, for example via FR filter 502, to compensate for the characteristic frequency response of the specified headphone model, resulting in an audio output that approximates an audio output that has been generated by an audio system with a target frequency response curve.

Figure 7B:
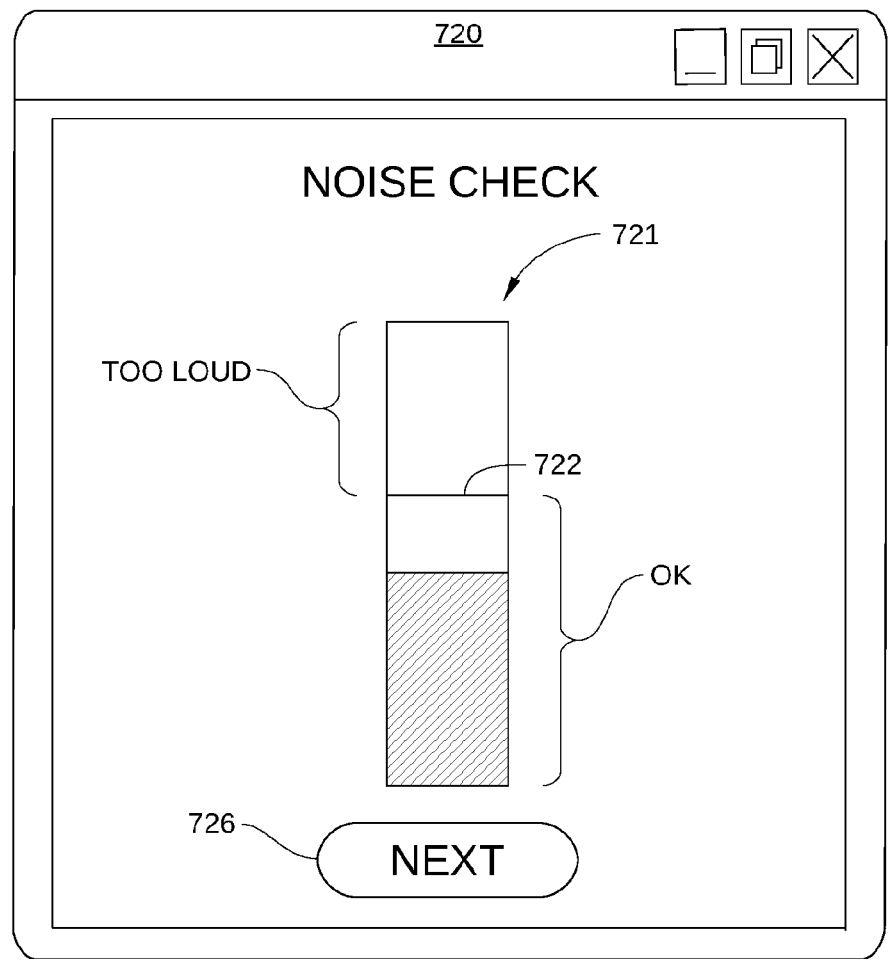
FIG. 7B schematically illustrates a noise level screen, according to an embodiment of the present disclosure.

FIG. 7B schematically illustrates a noise level screen 720, according to an embodiment of the present disclosure. Noise level screen 720 can be displayed via GUI 506 on one of I/O devices 580 of computing system 500. As shown, noise level screen 720 includes a noise level indicator 721 and an advancement button 726. In some embodiments, noise level indicator 721 graphically depicts a current noise level in the user's acoustic environment. In some embodiments, FR application 501 receives a noise signal from a microphone, where the noise level corresponds to the intensity of the noise signal in the acoustic environment. In some embodiments, noise level screen 720 includes a threshold noise level 722, above which a user cannot accurately judge one or more subjective qualities of sounds or music. For example, noise level indicator 721 can includes a lower noise level range of "OK" noise level intensities, and a higher noise level range of "TOO LOUD" noise level intensities. When the measured noise level is below threshold noise level 722, FR application 501 determines that an accurate acoustic filter response can be created. In instances where FR application 501 determines that an accurate acoustic filter response cannot be created due to the noise level, FR application 501 can suggest that the user move to a different acoustic environment with a lower noise intensity.

Figure 7C:
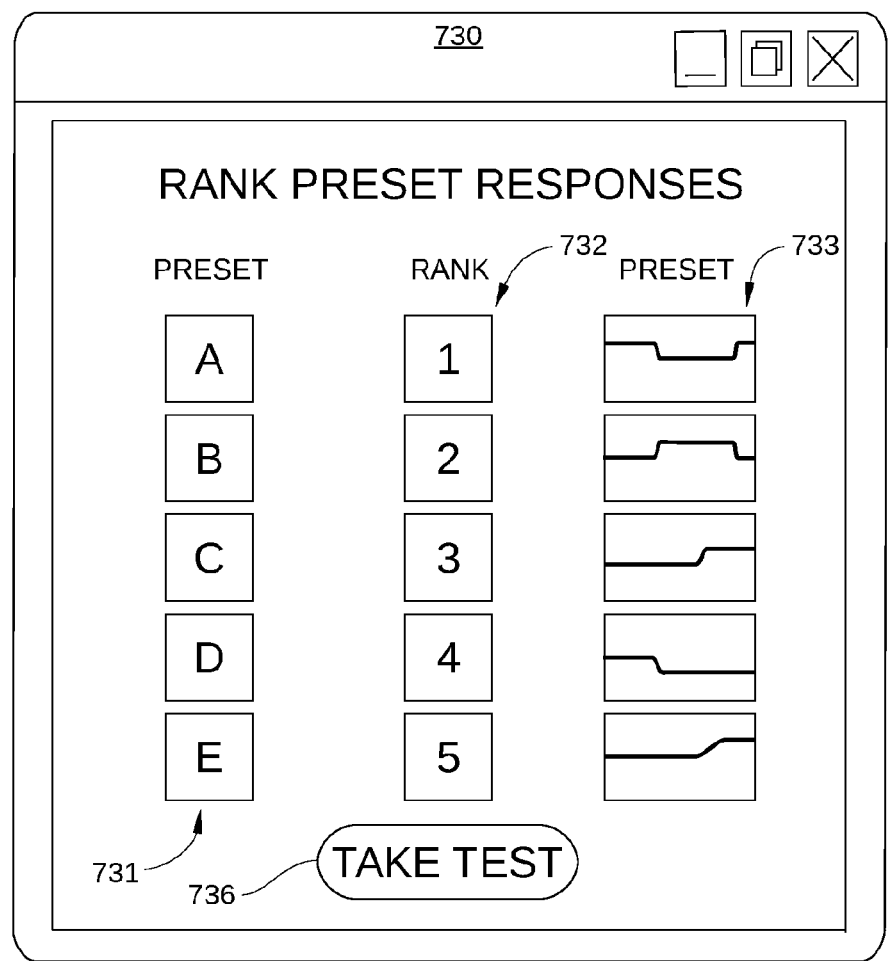
FIG. 7C schematically illustrates an acoustic preset ranking screen, according to an embodiment of the present disclosure.

FIG. 7C schematically illustrates an acoustic preset ranking screen 730, according to an embodiment of the present disclosure. Acoustic preset ranking screen 730 can be displayed via GUI 506 on one of I/O devices 580 of computing system 500. As shown, acoustic preset ranking screen 730 includes one or more preset filter response buttons 731, one or more user ranking input elements 732 that each correspond to one of preset filter response buttons 731, and a start test button 736. In some embodiments, each acoustic filter response button 731 enables a different preset filter response to be tested. Thus, user selection of a particular preset filter response button 731 initiates a test of specific preset filter response, in which a loop of music or other sound is played for the user that has been processed by that specific preset filter response. In some embodiments, a specific track can be selected by the user from a number of available tracks as the loop of music or other sound. In some embodiments, the loop of music or other sound can be paused, rewound, fast-forwarded, etc., via suitable control buttons (not shown) included in acoustic preset ranking screen 730. The specific preset filter response can then be rated by the user, via a corresponding user ranking input element 732. User ranking input elements 732 can be configured as drop-down menus, movable icons, character entry fields, and the like.

Generally, each acoustic filter response associated with a preset filter response button 731 includes one or more different equalization parameters. For example, each of the preset filter responses may include a bass boost equalization parameter (e.g., +6 dB adjustment to a low-frequency range), a treble boost equalization parameter (e.g., +6 dB adjustment to a high-frequency range), a balanced-boost equalization parameter (e.g., +3 dB adjustment to both a low and a high frequency range), and/or a treble cut equalization parameter (e.g., −3 dB adjustment to a mid-frequency range). Alternatively or additionally, each of the preset filter responses may include one or more other equalization parameters of different magnitude and frequency range.

In some embodiments, acoustic preset ranking screen 730 further includes a visual indicator 733 for each preset filter response button 731 that graphically illustrates some or all of the equalization parameters associated with that preset filter response button 731. Alternatively or additionally, in some embodiments, visual indicators 733 remain hidden until some or all of the acoustic filter responses associated with preset filter response buttons 731 have been tested. Once the user enters rankings for the preset filter responses, such information can be centrally collected and employed in further refining acoustic filter responses provided to subsequent users.

Figure 7D:
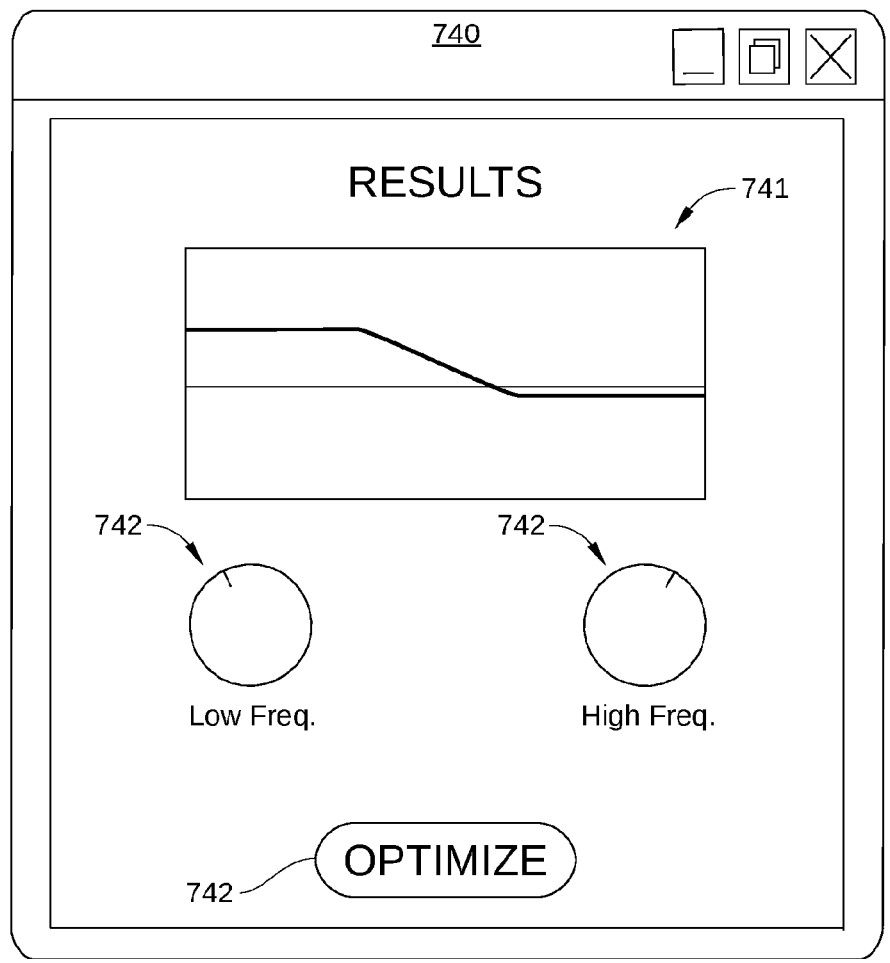
FIG. 7D schematically illustrates an acoustic preset results screen, according to an embodiment of the present disclosure.

FIG. 7D schematically illustrates an acoustic preset results screen 740, according to an embodiment of the present disclosure. Acoustic preset results screen 740 can be displayed via GUI 506 on one of I/O devices 580 of computing system 500. As shown, acoustic preset results screen 740 can includes a result graphic 741 and, in some embodiments, one or more optimization inputs 742. Result graphic 741 graphically illustrates equalization parameters associated with the highest ranking preset filter response button 731 when user inputs are completed. Optimization inputs 742 enable a user to implement more granular changes to a selected acoustic filter response employed by personalized filter generator 505 to generate personalized FR filter 503. For example, optimization inputs 742 can include treble and/or bass gain control knobs (as shown), when a user has entered a training or experience level that exceeds a specified threshold. Alternatively or additionally, in some embodiments, optimization inputs 742 are displayed to a user after a settings button or other optimization icon is selected by the user. Alternatively or additionally, in some embodiments, an optimization input 742 enables a user to begin the optimization process and cause one or more additional optimization inputs to be displayed to the user.

Figure 8:
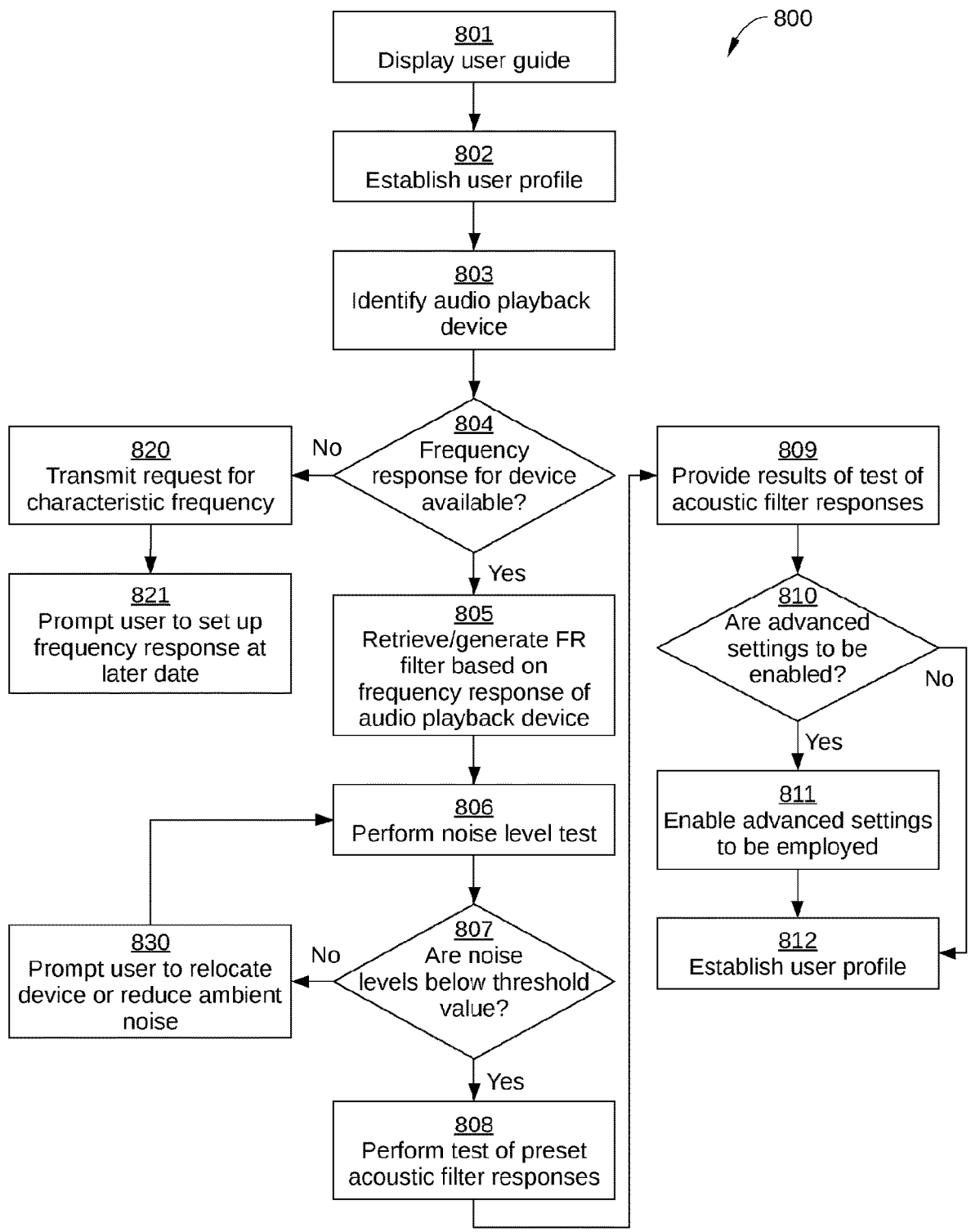
FIG. 8 sets forth a flowchart of method steps for compensating for a characteristic frequency response of a particular audio playback device, according to various embodiments of the present disclosure.

FIG. 8 sets forth a flowchart of method steps for compensating for a characteristic frequency response of a particular audio playback device, according to various embodiments of the present disclosure. FIG. 8 further includes method steps for performing a listening test that compares various preset modifications of a preferred target curve and making personalized adjustments of bass and treble levels. Although the method steps are described with respect to the systems of FIGS. 1-7, persons skilled in the art will understand that any system configured to perform the method steps, in any order, falls within the scope of the various embodiments. Prior to the method steps, FR application 501 is loaded onto computing system 500 or an audio system in which computing system 500 is incorporated is started up by a user.

As shown, a method 800 begins at step 801, in which FR application 501 causes a user guide or other instructions to be displayed to the user, for example via GUI 506.

In step 802, FR application 501 establishes a user profile. For example, in some embodiments, FR application 501 causes user information screen 710 to be displayed to the user. FR application 501 then receives one or more user inputs indicating certain user-specific information and/or device-specific information.

In step 803, FR application 501 identifies the audio playback device for which a characteristic frequency response is to be compensated, such as a specific model of headphones, vehicle-based audio system or infotainment system, smart speaker, or other audio system. In some embodiments, FR application 501 identifies the audio playback device based on information received in step 802. In other embodiments, FR application 501 identifies the audio playback device by querying the device directly, for example, by receiving a MAC address via a wireless connection with the audio playback device.

In step 804, FR application 501 determines whether a characteristic frequency response has been determined for the audio playback device. In some embodiments, the characteristic frequency response is stored, if available, in a local or remote database 531. If yes, then method 800 proceeds to step 805; if no, then method 800 proceeds to step 820.

In step 805, FR application 501 retrieves or generates a suitable FR filter 502 based on the characteristic frequency response for the audio playback device. Thus, in some embodiments, filter generator 504 of FR application 501 generates FR filter 502, while in other embodiments, FR filter 502 is retrieved from a remote database 531.

In step 806, FR application 501 performs a noise level test, by measuring a current noise level in the user's acoustic environment. In some embodiments, FR application 501 displays the results of the noise level test to the user.

In step 807, FR application 501 determines whether noise levels are below a threshold value and preset filter response tests can be performed. If yes, then method 800 proceeds to step 808, if no, then method 800 proceeds to step 830.

In step 808, FR application 501 performs tests of preset filter responses, for example, via acoustic preset ranking screen 730. In some embodiments, each of the preset filter responses is tested multiple times. Alternatively or additionally, in some embodiments, each of the preset filter responses is tested in random order. Alternatively or additionally, in some embodiments, combinations of the highest ranking preset filter responses may be tested. Thus, in such embodiments, an acoustic filter response is generated based on a ranking of two or more of the preset filter responses. After some or all available acoustic filter responses are tested and ranked by the user, method 800 proceeds to step 809.

In step 809, FR application 501 provides results of the tests of preset filter responses, for example, via acoustic preset results screen 740.

In step 810, FR application 501 determines whether advanced settings are to be enabled for the user, such as higher-granularity adjustments to a selected preset filter response shown in FIG. 7D. In some embodiments, the determination is based on the training or experience level input by the user. In some embodiments, the determination is based on an input from the user requesting the use of advanced settings, such as an input via a suitable icon being displayed to the user. If advanced settings are to be enabled for the user, then method 800 proceeds to step 811; if not, then method 800 proceeds to step 812.

In step 811, FR application 501 enables advanced settings to be employed by the user, for example by causing optimization inputs 742 to be displayed to the user. FR application 501 then receives user inputs that modify portions of the highest-ranking preset filter response. In some embodiments, optimization inputs 742 are limited to modifying frequency response in certain frequency bands, for example, high-frequency and low-frequency bands, and are prevented from modifying other frequency bands, for example, a mid-frequency band.

In step 812, FR application 501 finalizes a user profile specific to the user and the audio system associated with computing system 500 and method 800 terminates. For example, FR application 501 stores an FR filter 502 and/or a personalized FR filter 503 in database 531. Subsequently, whenever the user employs the audio system, the stored FR filter 502 and/or the personalized FR filter 503 are employed to process an audio input signal.

Step 820 is performed in response to FR application 501 determining that a characteristic frequency response is not available for the audio playback device. In step 820, FR application 501 transmits a request for a characteristic frequency response (and in some embodiments an associated FR filter) to be determined for the audio playback device. In step 821, FR application 501 prompts the user to attempt to set up the frequency response of the audio playback device at a later date.

Step 830 is performed in response to FR application 501 determining that noise levels are above a threshold level and accurate preset filter response tests cannot be performed. In step 830, FR application 501 prompts the user to relocate the audio playback device and/or reduce ambient noise before attempting to perform preset filter response tests.

In sum, various embodiments set forth systems and techniques for compensating for a characteristic frequency response of a particular audio playback device. In the embodiments, a frequency response application modifies an input signal for an audio system to compensate for a frequency response of the audio system. The frequency response application applies a frequency response filter to modify the input signal. In some embodiments, the input signal is modified so that a resulting audio output approximates an audio output that is generated by an audio system having a specific target frequency response curve.

At least one technological improvement of the disclosed embodiments is that a user can have an improved listening experience during playback of recorded music and other audio content. More specifically, the disclosed embodiments enable an audio system to generate audio output that closely approximates original sound content prior to being recorded, even though the audio system has an inherent frequency response that substantially affects the audio output during playback. That is, unwanted elements of the frequency response of the audio system can be compensated for. A further advantage is that a user can easily modify audio output generated by the audio system to match a personalized acoustic response that corresponds to an equalization of the original sound content prior to the sound content being recorded.

1. In some embodiments, a computer-implemented method includes: identifying an audio playback device configured to reproduce audio content based on an audio input signal, wherein the audio playback device has a previously measured characteristic frequency response; generating, based on the previously measured characteristic frequency response and a preferred frequency response curve for a plurality of users, a frequency response filter that modifies the previously measured characteristic frequency response of the audio playback device to a modified frequency response; processing the audio input signal with the frequency response filter to generate a filtered audio signal that differs in relative amplitude from the audio input signal in one or more frequency bands; and causing the audio playback device to play back the filtered audio signal.

2. The computer-implemented method of clause 1, further comprising, prior to identifying the audio playback device, retrieving the previously measured characteristic frequency response associated with the audio playback device.

3. The computer-implemented method of clauses 1 or 2, further comprising, prior to processing the audio input signal, modifying the frequency response filter based on at least one user-preferred frequency response.

4. The computer-implemented method of any of clauses 1-3, wherein modifying the frequency response filter comprises: playing back a test audio signal with the audio playback device by processing the test audio signal with the frequency response filter and a preset filter response; and after playing back the test audio signal, receiving a user input indicating that the preset filter response corresponds to the at least one user-preferred frequency response.

5. The computer-implemented method of any of clauses 1-4, wherein the modified frequency response is based on a target frequency response curve.

6. The computer-implemented method of any of clauses 1-5, wherein the target frequency response curve is configured to compensate for at least a portion of the previously measured characteristic frequency response.

7. The computer-implemented method of any of clauses 1-6, wherein the target frequency response curve is based on a preferred frequency response curve for a plurality of users.

8. The computer-implemented method of any of clauses 1-7, wherein the preferred frequency response curve for the plurality of users comprises an average frequency response curve for the plurality of users.

9. The computer-implemented method of any of clauses 1-8, wherein the target frequency response curve is based on a preset filter response.

10. The computer-implemented method of any of clauses 1-9, wherein the target frequency response curve is based on a combination of a first preset filter response and a second preset filter response.

11. The computer-implemented method of any of clauses 1-10, wherein identifying the audio playback device comprises determining a model of the audio playback device based on information received from the audio playback device.

12. The computer-implemented method of any of clauses 1-11, wherein identifying the audio playback device comprises receiving a user input indicating the model of the audio playback device.

13. In some embodiments, a computer-implemented method includes: receiving one or more user inputs indicating user-specific information; based on at least a portion of the user-specific information, generating a personalized acoustic filter response; and based on the personalized acoustic filter response, adjusting a frequency response of an audio playback device.

14. The computer-implemented method of clause 13, wherein the user-specific information comprises demographic information associated with the user.

15. The computer-implemented method of clauses 13 or 14, further comprising adjusting the frequency response of the audio playback device based on a previously measured characteristic frequency response of the audio playback device.

16. The computer-implemented method of any of clauses 13-15, wherein adjusting the frequency response of the audio playback device based on the previously measured characteristic frequency response of the audio playback device comprises: identifying the audio playback device; and retrieving a frequency response filter that is based on the previously measured characteristic frequency response of the audio playback device.

17. In some embodiments, a computer-implemented method includes: receiving a first user ranking of a first acoustic filter response and a second user ranking of a second acoustic filter response; based on the first user ranking and the second user ranking, generating a third acoustic filter response; and based on the third acoustic filter response and a previously measured characteristic frequency response of an audio playback device, adjusting a frequency response of the audio playback device.

18. The computer-implemented method of clause 17, wherein the third acoustic filter response comprises a combination of the first acoustic filter response and the second acoustic filter response.

19. The computer-implemented method of clauses 17 or 18, further comprising: prior to receiving the first user ranking, playing back a test audio signal with the audio playback device by processing the test audio signal with the first acoustic filter response; and prior to receiving the second user ranking, playing back the test audio signal with the audio playback device by processing the test audio signal with the second acoustic filter response.

20. The computer-implemented method of any of clauses 17-19, further comprising: receiving model information for the audio playback device; and based on the model information, retrieving the previously measured characteristic frequency response of the audio playback device.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." In addition, any hardware and/or software technique, process, function, component, engine, module, or system described in the present disclosure may be implemented as a circuit or set of circuits. Furthermore, aspects of the present disclosure may take the form of a computer program product embodied in at least one computer readable medium having computer readable program code embodied thereon.

Any combination of at least one computer readable medium may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having at least one wire, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors or gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises at least one executable instruction for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method comprising:
identifying an audio playback device configured to reproduce audio content based on an audio input signal, wherein the audio playback device has a previously measured characteristic frequency response;
receiving a target frequency response curve that is based on a plurality of preferred frequency responses, wherein each preferred frequency response is selected by at least one user of a plurality of users;
generating, based on the previously measured characteristic frequency response and the target frequency response curve, a frequency response filter that modifies the previously measured characteristic frequency response of the audio playback device to a modified frequency response;
processing the audio input signal with the frequency response filter to generate a filtered audio signal that differs in relative amplitude from the audio input signal in one or more frequency bands; and
causing the audio playback device to play back the filtered audio signal.

2. The computer-implemented method of claim 1, further comprising, prior to identifying the audio playback device, retrieving the previously measured characteristic frequency response associated with the audio playback device.

3. The computer-implemented method of claim 1, further comprising, prior to processing the audio input signal, modifying the frequency response filter based on at least one user-preferred frequency response.

4. The computer-implemented method of claim 3, wherein modifying the frequency response filter comprises:
playing back a test audio signal with the audio playback device by processing the test audio signal with the frequency response filter and a preset filter response; and
after playing back the test audio signal, receiving a user input indicating that the preset filter response corresponds to the at least one user-preferred frequency response.

5. The computer-implemented method of claim 1, wherein
the target frequency response curve is configured to compensate for at least a portion of the previously measured characteristic frequency response.

6. The computer-implemented method of claim 1, wherein the target frequency response curve is based on a combination of the preferred frequency response selected by each user of the plurality of users.

7. The computer-implemented method of claim 6, wherein the combination of the preferred frequency response curves comprises an average of the preferred frequency response selected by each user of the plurality of users.

8. The computer-implemented method of claim 1, wherein the target frequency response curve is based on a preset filter response.

9. The computer-implemented method of claim 8, wherein the target frequency response curve is based on a combination of a first preset filter response and a second preset filter response.

10. The computer-implemented method of claim 1, wherein identifying the audio playback device comprises determining a model of the audio playback device based on information received from the audio playback device.

11. The computer-implemented method of claim 1, wherein identifying the audio playback device comprises receiving a user input indicating a model of the audio playback device.

12. A computer-implemented method comprising:
receiving one or more user inputs indicating user-specific information of a user of an audio playback device;
receiving a device-specific frequency response that compensates for a measured characteristic frequency response of the audio playback device;
receiving a target frequency response curve that is based on a plurality of preferred frequency responses, wherein each preferred frequency response is selected by at least one user of a plurality of users, and the at least one user is associated with at least a portion of the user-specific information;
generating a personalized acoustic filter response based on a combination of the target frequency response curve and the device-specific frequency response; and
based on the personalized acoustic filter response, adjusting a frequency response of the audio playback device.

13. The computer-implemented method of claim 12, wherein the user-specific information comprises demographic information associated with the user.

14. The computer-implemented method of claim 12, further comprising adjusting the frequency response of the audio playback device based on a previously measured characteristic frequency response of the audio playback device.

15. The computer-implemented method of claim 14, wherein adjusting the frequency response of the audio playback device based on the previously measured characteristic frequency response of the audio playback device comprises:
identifying the audio playback device; and
retrieving a frequency response filter that is based on the previously measured characteristic frequency response of the audio playback device.

16. A computer-implemented method comprising:
receiving a first user ranking of a first acoustic filter response and a second user ranking of a second acoustic filter response, wherein each of the first acoustic filter response and the second acoustic filter response is generated from a respective target frequency response based on a plurality of preferred frequency responses, and each preferred frequency response is selected by at least one user of a plurality of users;
based on the first user ranking and the second user ranking, generating a third acoustic filter response; and
based on the third acoustic filter response and a previously measured characteristic frequency response of an audio playback device, adjusting a frequency response of the audio playback device.

17. The computer-implemented method of claim 16, wherein the third acoustic filter response comprises a combination of the first acoustic filter response and the second acoustic filter response.

18. The computer-implemented method of claim 16, further comprising:

prior to receiving the first user ranking, playing back a test audio signal with the audio playback device by processing the test audio signal with the first acoustic filter response; and prior to receiving the second user ranking, playing back the test audio signal with the audio playback device by processing the test audio signal with the second acoustic filter response.

19. The computer-implemented method of claim 18, further comprising:

receiving model information for the audio playback device; and based on the model information, retrieving the previously measured characteristic frequency response of the audio playback device.

* * * * *